United States Patent [19]

Yoshida

[11] Patent Number: 5,530,767
[45] Date of Patent: Jun. 25, 1996

[54] RECEPTION VOLUME LIMITING CIRCUIT

[75] Inventor: Toshio Yoshida, Tokyo, Japan

[73] Assignee: NEC Corporation, Tokyo, Japan

[21] Appl. No.: 362,852

[22] Filed: Dec. 23, 1994

[30] Foreign Application Priority Data

Dec. 28, 1993 [JP] Japan .................................. 5-335280

[51] Int. Cl.$^6$ ........................................................ A61F 11/06
[52] U.S. Cl. ............................. 381/72; 381/108; 379/395
[58] Field of Search ............................... 381/72, 74, 68.2, 381/104, 106–108, 25; 379/395, 390, 388; 455/234.1; 333/14

[56] References Cited

U.S. PATENT DOCUMENTS

| | | | |
|---|---|---|---|
| 3,745,262 | 7/1973 | Brolin et al. | 379/395 |
| 3,902,023 | 8/1975 | Lindgren | 379/395 |
| 4,112,384 | 9/1978 | Buchberger | 381/107 |
| 4,250,470 | 2/1981 | Szarvas | 455/72 |
| 4,466,119 | 8/1984 | Peters et al. | 381/108 |
| 4,628,526 | 12/1986 | Germer | 381/108 |
| 5,070,527 | 12/1991 | Lynn | 381/106 |
| 5,303,308 | 4/1994 | Larsen et al. | 381/72 |
| 5,359,653 | 10/1994 | Walker et al. | 379/390 |
| 5,404,315 | 4/1995 | Nakano et al. | 381/107 |
| 5,448,620 | 9/1995 | Gershkovich et al. | 381/107 |
| 5,471,651 | 11/1995 | Wilson | 381/106 |

FOREIGN PATENT DOCUMENTS 62-146032 6/1987 Japan .
2-119359 5/1990 Japan .

*Primary Examiner*—Curtis Kuntz
*Assistant Examiner*—Ping W. Lee
*Attorney, Agent, or Firm*—Young & Thompson

[57] ABSTRACT

A reception volume limiting circuit includes a detecting section, an A/D conversion section, a control section, and a speech data calculating section. The detecting section performs detection/rectification and smoothing of a receiver driving AC signal and outputs a DC signal corresponding to the level of the receiver driving AC signal. The A/D conversion section converts the DC signal into a digital signal. The control section calculates a time average value by averaging the digital signal every predetermined time interval, adds the currently stored attenuation amount to the time average value, and compares the time average value with a predetermined threshold value representing a critical sound pressure for protection of listener's hearing. If the time average value exceeds the threshold value, the control section calculates an excess level from the difference between the two values, stores the excess level as a current attenuation amount, and outputs a volume attenuation command having the excess level as an attenuation amount. The speech data calculating section performs subtraction processing of the reception speech data, in response to the volume attenuation command, on the basis of the excess level included in the command and outputs reception speech data attenuated by a value corresponding to the excess level.

3 Claims, 5 Drawing Sheets

RECEPTION VOLUME LIMITING CIRCUIT

BACKGROUND OF THE INVENTION

The present invention relates to a reception volume limiting circuit and, more particularly, to a reception volume limiting circuit for limiting the gain of a speech signal received by a mobile telephone set or the like.

As shown in FIG. 5, a conventional reception volume limiting circuit for a telephone set is constituted by a descramble circuit 51 for decoding reception speech signal data, a D/A conversion section 52 for converting the decoded data into an analog signal, a volume control section 53 for voltage-controlling the level of the analog signal, a detector 54 for generating a speech control voltage from the decoded reception speech signal data, and an amplifier 55 (e.g., Japanese Patent Laid-Open No. 62-146032).

A reception volume limiting operation is performed as follows. In a normal descramble (privacy decoding) operation, no volume limiting operation is performed. When a descramble operation cannot be executed, or an abnormal descramble operation is performed, e.g., privacy codes on the transmitting and receiving sides differ from each other, a digital signal is input from the descramble circuit 51 to the detector 54. If speech signals having levels higher than a predetermined value are frequently detected within a predetermined period of time, it is determined that high-level noise is generated. As a result, a control signal Vc is output from the detector 54. The reception volume is limited by the volume control section 53 in accordance with this control signal Vc.

FIG. 6 shows a multi-functional telephone set which detects the voltage of power supplied from an electronic switching apparatus, and limits the volume of a speaker when the voltage becomes lower than a predetermined voltage (e.g., Japanese Patent Laid-Open No. 2-119359).

A reception volume limiting operation is performed as follows. When a cable 62 is extended, a decrease in a power supply voltage applied from an electronic switching apparatus 61 via a pulse transformer 63 is detected by a voltage detector 65. If it is determined that the decrease in voltage causes a trouble in supply of power from a DC/DC converter 64, the volume of a speaker amplifier 67 is limited by a volume limit signal 66. With this operation, the power consumption is limited to prevent a decrease in power supply voltage due to extension of the cable 62, thereby ensuring stable supply of power from the DC/DC converter 64.

The above conventional reception volume limiting circuits perform reception volume limiting operations mainly for the following purposes. The purpose of the former circuit is to reduce an unpleasant sound which is temporarily generated. The purpose of the latter circuit is to ensure stable application of a power supply voltage when a decrease in supply voltage occurs. If, therefore, an excessive reception volume signal is input abruptly or continuously during a normal reception speech signal hearing operation, it is difficult to effectively prevent the listener from having difficulty in hearing.

In addition, a conventional portable telephone set or the like is designed to passively restrict the output sound pressure, within a sound pressure level range in which no difficulty in hearing is caused, on the basis of the set power supply voltage of a receive amplifier or the electroacoustic conversion efficiency of a receiver used. In practice, however, the speech peak level often exceeds the above sound pressure level range owing to the influences of ambient noise and the like. According to the above passive limiting circuit, since the electroacoustic characteristics of the receive amplifier or the receiver exhibit a nonlinear region near the upper limit level, a considerable deterioration in sound quality occurs.

SUMMARY OF THE INVENTION

The present invention has been made to solve the above problems, and has as its object to provide a reception volume limiting circuit which can always prevent a listener from difficulty in hearing and can obtain a reproduced sound with little distortion.

In order to achieve the above object, according to the present invention, there is provided a reception volume limiting circuit for converting reception speech data as a digital code into an analog receiver driving AC signal and outputting the signal, comprising a detecting section for performing detection/rectification and smoothing of the receiver driving AC signal and outputting a DC signal corresponding to a level of the receiver driving AC signal, an A/D conversion section for converting the DC signal from the detecting section into a digital signal, a control section for calculating a time average value by averaging the digital signal from the A/D conversion section every predetermined time interval, adding a currently stored attenuation amount to the time average value, comparing the time average value with a predetermined threshold value representing a critical sound pressure for protection of listener's hearing, calculating an excess level from a difference between the time average value and the threshold value when the time average value exceeds the threshold value, storing excess level as an attenuation amount, and a speech data calculating section, having means for attenuating a reception volume level by performing subtraction processing of the reception speech data, for performing subtraction processing of the reception speech data, in response to the volume attenuation command from said control section, on the basis of the excess level included in the command and outputting reception speech data attenuated by a value corresponding to the excess level.

With this arrangement, the receiver driving AC signal is converted into a DC signal by the detecting section. The DC signal is converted into a digital signal by the A/D conversion section. A time average value is calculated by averaging the digital signal every predetermined time interval. If the time average value exceeds the threshold value, a volume attenuation command having a value corresponding to the excess level as an attenuation amount is output. In response to this command, the speech data calculating section outputs reception speech data attenuated by a value corresponding to the attenuation amount. The data is converted into a receiver driving AC signal and output from the receiver.

DESCRIPTION OF THE PREFERRED EMBODIMENT

The present invention will be described below with reference to the accompanying drawings.

Figure 1:
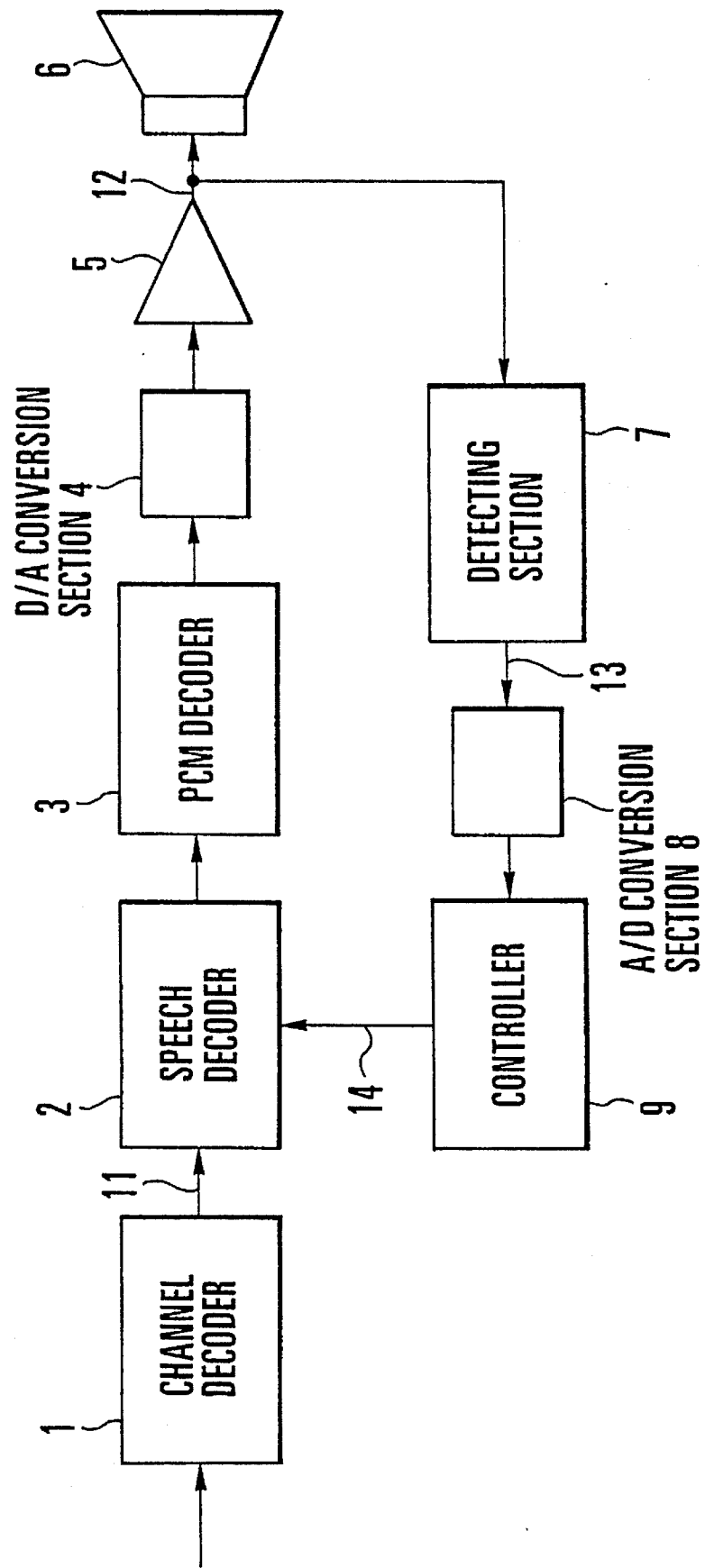
FIG. 1 is a block diagram showing a reception volume limiting circuit according to an embodiment of the present invention.

FIG. 1 shows a reception volume limiting circuit according to an embodiment of the present invention, and more specifically, a reception volume limiting circuit using the receive circuit of a mobile telephone set as a receive circuit for converting reception speech data as a digital code into an analog signal and outputting the signal.

Referring to FIG. 1, reference numeral 1 denotes a channel decoder for extracting control data and speech data 11 from a predetermined radio channel of a received radio signal, and separating and outputting the speech data 11; 2, a speech decoder (speech data calculating section) for converting the speech data 11 from the channel decoder 1 into PCM data according to a predetermined speech compression scheme, and performing subtraction processing of the volume level of the PCM data in accordance with a volume attenuation command, thereby outputting the PCM data upon attenuating the volume level; and 3, a PCM decoder for converting the PCM data from the speech decoder 2 into μLow data.

Reference numeral 4 denotes a D/A conversion section for converting the μLow data from the PCM decoder 3 into an analog signal; 5, a receiver amplifier for amplifying the analog signal from the D/A conversion section 4 and outputting a receiver driving AC signal 12 for driving a receiver 6; 7, a detecting section for performing detection/rectification and smoothing of the receiver driving AC signal 12 from the receiver amplifier 5, and outputting a DC signal 13; 8, an A/D conversion section for converting the DC signal 13 from the detecting section 7 into a digital signal; and 9, a controller (control section) for comparing the digital signal from the A/D conversion section 8 with a predetermined threshold value, and outputting a volume attenuation command including an excess level 14 to the speech decoder 2 when the digital signal exceeds the threshold value.

Figure 2:
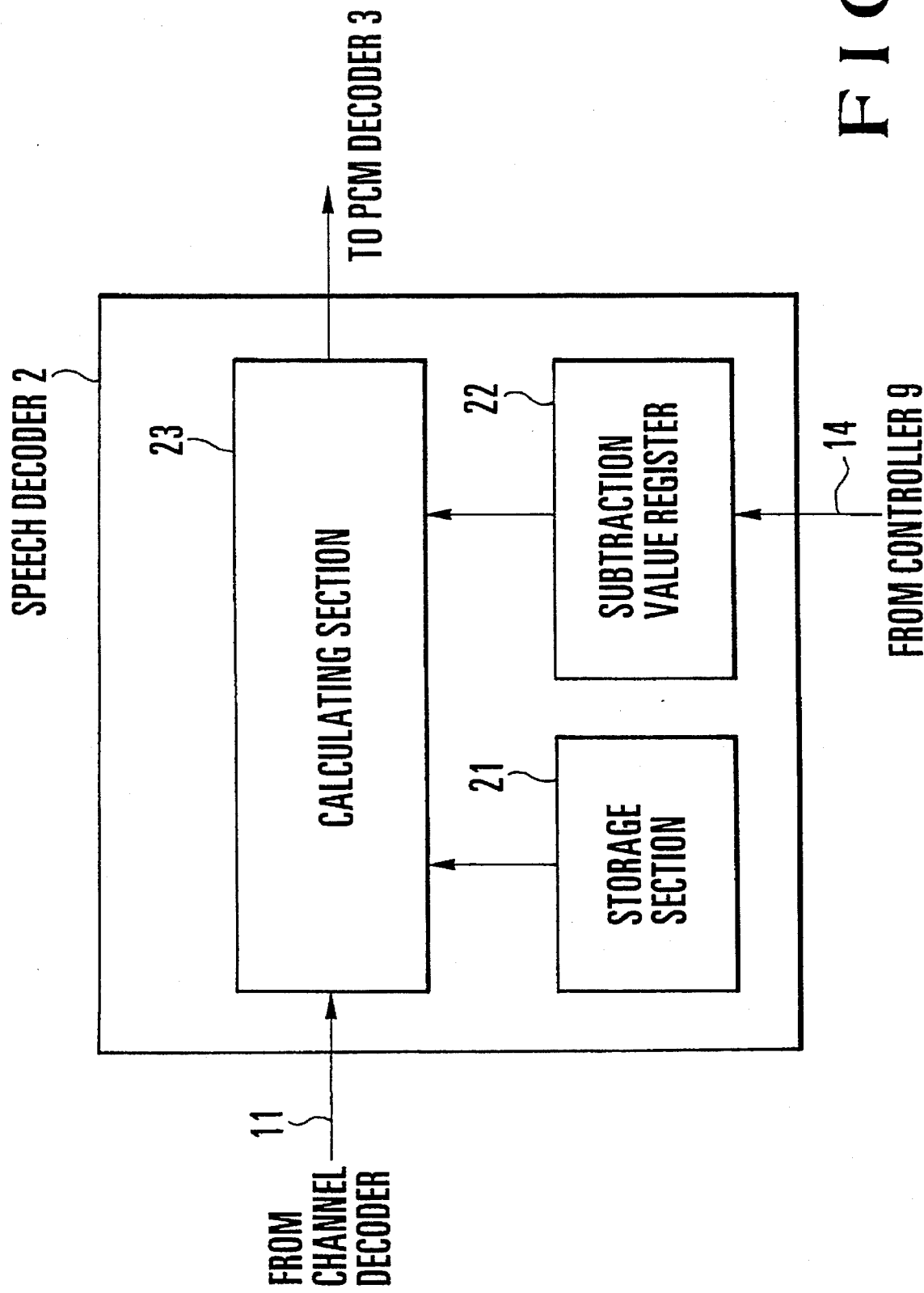
FIG. 2 is a functional block diagram showing speech data.

FIG. 2 shows the speech decoder 2. Referring to FIG. 2, reference numeral 21 denotes a storage section for storing speech sample data corresponding to each speech data 11; 22, a subtraction value register for storing the excess level 14 as a subtraction value in accordance with the volume attenuation command from the controller 9; and 23, calculating section for extracting the speech sample data corresponding to the speech data 11, supplied from the channel decoder 1, from the storage section 21, and performing subtraction processing of the speech sample data on the basis of the subtraction value stored in the subtraction value register 22, thereby outputting the resultant data as PCM data.

FIGS. 3A to 3D show signals in the respective components in FIG. 1. The operation of the present invention will be described below with reference to FIGS. 3A TO 3D.

Figure 3A:
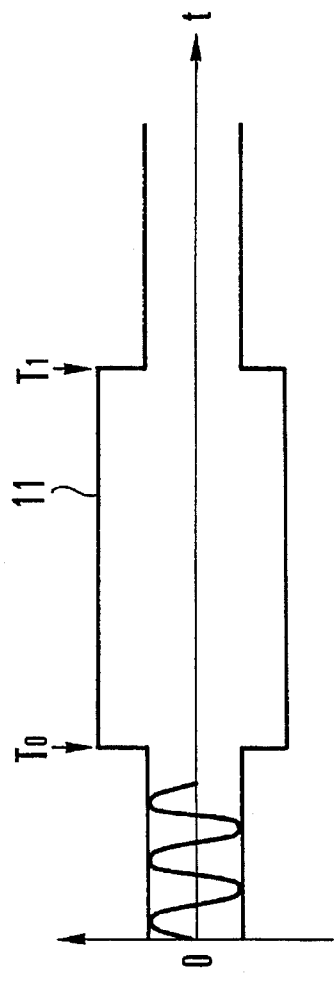
FIGS. 3A to 3D are timing charts showing the waveforms of signals in the respective components of the embodiment shown in FIG. 1.
Figure 3B:
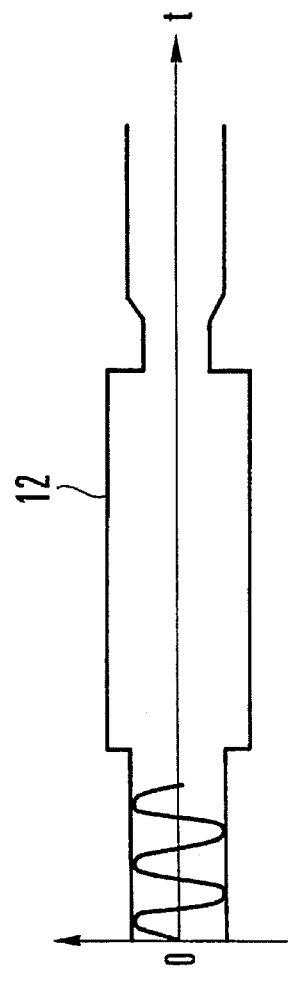
Figure 3C:
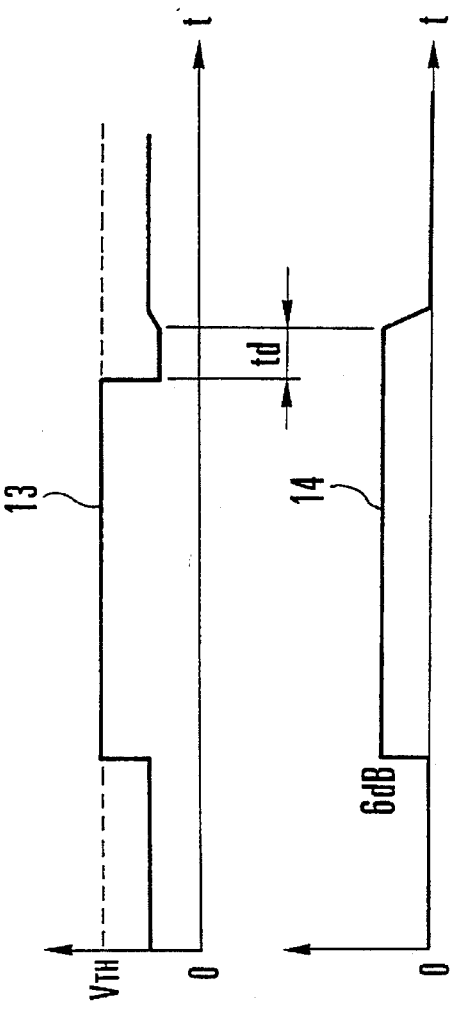
Figure 3D:
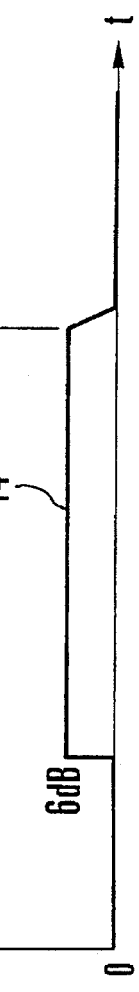

FIG. 3A shows the speech data 11 output from the channel decoder 1. In this case, the speech data 11, which is essentially digital information, is shown as analog information. FIG. 3B shows the receiver driving AC signal 12 output from the receiver amplifier 5. FIG. 3C shows the DC signal 13 output from the detecting section 7. FIG. 3D shows the excess level 14 included in the volume attenuation command output from the controller 9.

Before time T0, the speech data 11 having a predetermined volume level is output from the channel decoder 1, converted into PCM data by the speech decoder 2, and input to the receiver amplifier 5 via the PCM decoder 3 and the D/A conversion section 4. As a result, the receiver driving AC signal 12 is output to the receiver 6.

At the same time, the receiver driving AC signal 12 is also input to the detecting section 7 to undergo detection/rectification so as to become the DC signal 13. The DC signal 13 is converted into a digital signal by the A/D conversion section 8. The digital signal is then input to the controller 9.

Figure 4:
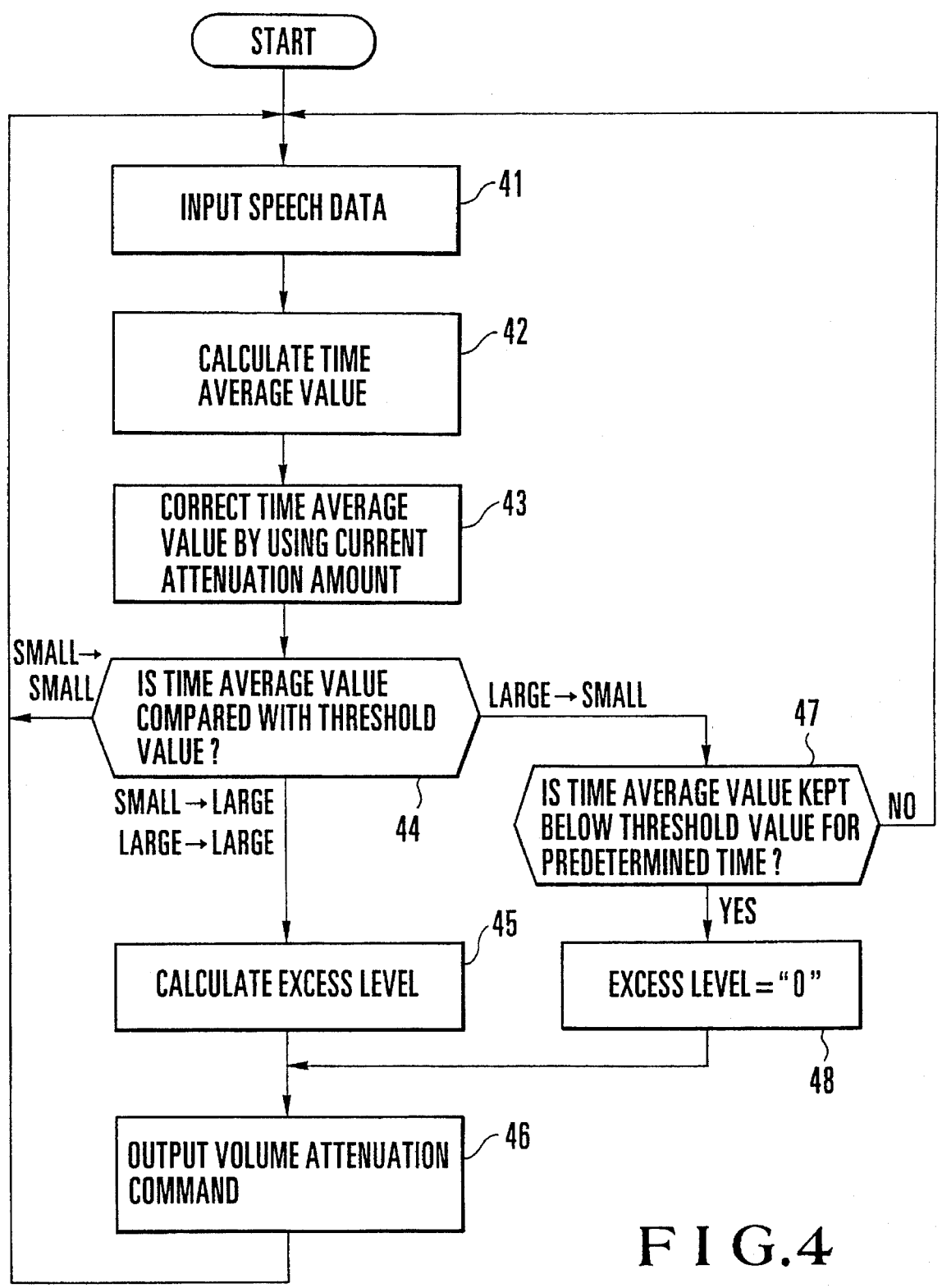
FIG. 4 is a flow chart showing the procedure of a controller.
Figure 5:
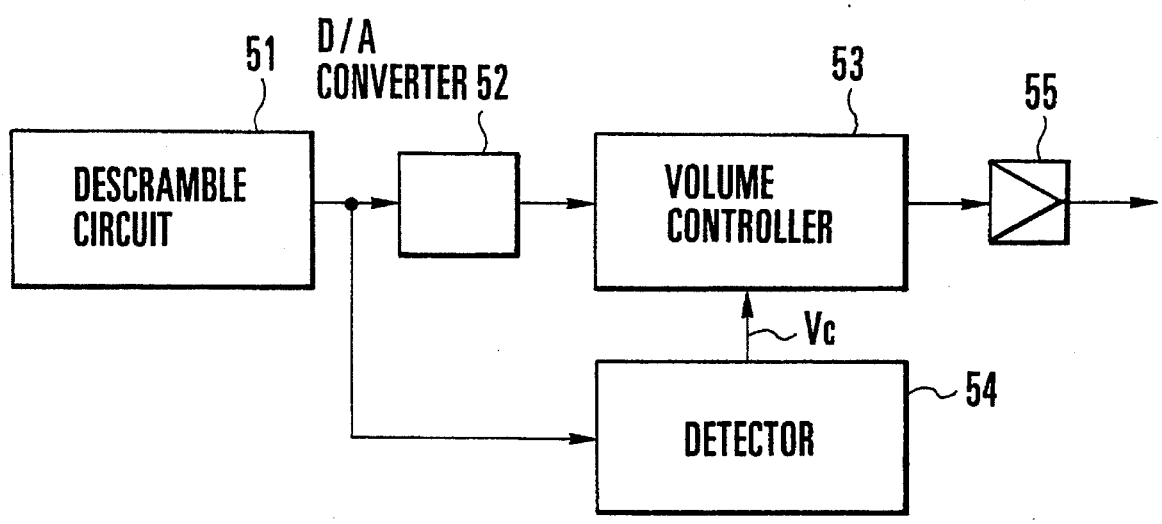
FIG. 5 is a block diagram showing a conventional reception volume limiting circuit.
Figure 6:
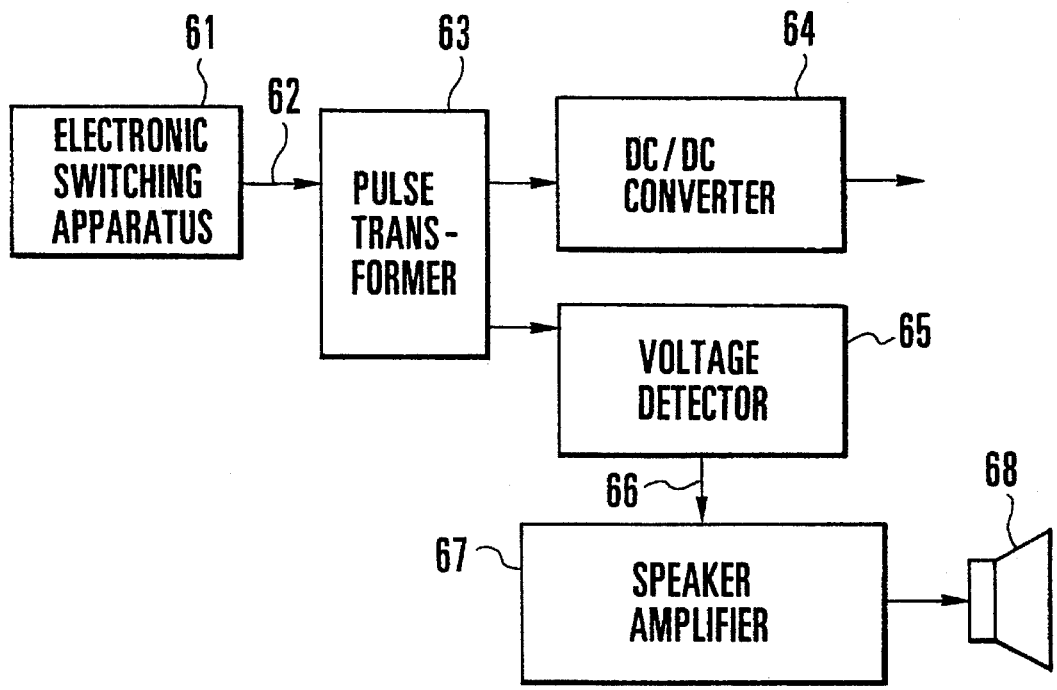
FIG. 6 is a block diagram showing another conventional reception volume limiting circuit.

FIG. 4 shows the procedure of the controller 9. The operation of the controller 9 will be described below.

In step 41, a digital signal indicating the level of the receiver driving AC signal 12 output to the receiver 6 is input from the A/D conversion section 8. In step 42, the average value of the levels of the receiver driving AC signal 12 is obtained every predetermined time interval to calculate a time average value. In step 43, the same attenuation amount as the value set in the subtraction value register 22 of the speech decoder 2 is added to the time average value to correct the time average value.

In step 44, this time average value is compared with a predetermined threshold value VTH.

This threshold value VTH is set to a value corresponding to the critical sound pressure as the level of speech output from the receiver 6 at which the hearing of the listener can be protected. For example, the threshold value VTH is set to a value corresponding to 120 dBspl. If the calculated time average value is smaller than the threshold value VTH and does not change (i.e., time interval value exhibits a "small→small" change), it is determined that the level of a sound currently output from the receiver 6 is lower than the critical sound pressure for protection of listener's hearing. As a result, the flow returns to step 41.

With this operation, no volume attenuation command is output from the controller 9, so that the receiver driving AC signal 12 having the same level as that of the speech data 11 from the channel decoder 1 is output to the receiver 6.

Assume that the level of the speech data 11 from the channel decoder 1 increases afterward, and the receiver driving AC signal 12 from the receiver amplifier 5 increases accordingly at time T0. In this case, this change is detected by the controller 9 via the detecting section 7 and the A/D conversion section 8. If it is determined in step 44 that the time average value of the receiver driving AC signal 12 exceeds the threshold value and exhibits a "small→large" change, the flow advances to step 45 to calculate the excess level 14, e.g., 6 dB, as the difference between the time average value and the threshold value, and store it as a current attenuation amount. In step 46, a volume attenuation command including the excess level 14 is output from the controller 9 to the speech decoder 2.

In accordance with this operation, the excess level 14 included in the volume attenuation command is stored in the subtraction value register 22. Subsequently, the calculating section 23 of the speech decoder 2 subtracts a value corresponding to the excess level 14 stored in the subtraction value register 22 from speech sample data read out from the storage section 21 in accordance with the speech data 11 from the channel decoder 1, thereby outputting PCM data whose speech level is attenuated by the value corresponding to the excess level 14.

As described above, the means for performing subtraction processing of a digital speech code, i.e., PCM data, is arranged in the speech decoder 2, and the level of the receiver driving AC signal 12 output to the receiver 6 is always compared with the threshold value VTH corresponding to the critical sound pressure for protection of listener's hearing. When the level of the receiver driving AC signal 12 exceeds the threshold value VTH, a volume attenuation command including the excess level 14 is immediately output from the controller 9 to the speech decoder 2 to output PCM data which is attenuated by a value corresponding to the excess level 14. With this operation, therefore, if reception speech exceeding the critical sound pressure for protection of listener's hearing is input, the speech can be attenuated more quickly than in the conventional passive limiting circuit. In addition, the speech can be attenuated with less distortion, thereby realizing prevention of difficulty in hearing without causing the listener to feel a sense of incongruity.

If the level of the speech data 11 decreases at time T1, the level of the receiver driving AC signal 12 from the receiver amplifier 5 also decreases. As a result, the level of the DC signal 13 from the detecting section 7 decreases, and the DC signal 13 is input to the controller 9 via the A/D conversion section 8.

In the controller 9, a time average value is calculated in step 42 in the same manner as described above. In step 43, the current attenuation amount stored in the internal register is added to the time average value to correct the time average value. In step. 44, the time average value is compared with the threshold value VTH.

If it is determined from the comparison result that the time average value is smaller than the threshold value VTH, i.e., the time average value exhibits a "large→small" change, the flow advances to step 47 to monitor whether the time average value is kept below the threshold value VTH for a predetermined time td. If the time average value is kept below the threshold value VTH for the predetermined time td or more (YES in step 47), the excess level 14 is set to be "0" and is stored, as the current attenuation amount, in the internal register. The flow then advances to step 46. In step 46, the controller 9 outputs a volume attenuation command having "0" as the excess level 14, i.e., a volume attenuation cancel command, to the speech decoder 2.

In response to this command, attenuation of reception speech in the speech decoder 2 is stopped, and the receiver driving AC signal 12 having the same level as that of the input reception speech is output to the receiver 6.

As described above, if the time average value is kept below the threshold value VTH for the predetermined time td, attenuation of reception speech is stopped. Even if, therefore, the level of reception speech varies to a certain degree, a stable operation can be performed. That is, insertion/cancellation of an attenuation command is not frequently performed with such variations, thereby preventing the listener from feeling a sense of incongruity.

If it is determined in step 47 that the time average value is not kept below the threshold value VTH for the predetermined time td (NO in step 47), the flow returns to step 41. In step 41, new speech data is input.

If it is determined in step 44 that the time average value is still larger than the threshold value VTH, i.e., the time average value exhibits a change "large→large" change, steps 45 and 46 are executed. As a result, a volume attenuation command corresponding to the excess level 14 is output.

In the above description, if the time average value is kept below the threshold value VTH for the predetermined time td, a volume attenuation command corresponding to "0" as the excess level 14 is immediately output in steps 48 and 49. However, a volume attenuation command may be output several times such that the excess level 14 is gradually reduced from its latest value. By smoothly reducing the attenuation amount, cancelation of the attenuation can be performed more naturally.

As has been described, the present invention includes the speech data calculating section having the means for attenuating the reception volume level by performing subtraction processing of reception speech data. The control section compares a time average value representing the average value of the levels of a receiver driving AC signal with a predetermined threshold value indicating the critical sound pressure for protection of listener's hearing. If the time average value exceeds the threshold value, an excess level is calculated from the different between the time average value and the threshold value, and a volume attenuation command having this excess level as an attenuation amount is output to the speech data calculating section. With this operation, reception speech data attenuated by a value corresponding to the excess level is output from the speech data calculating section. Even if, therefore, reception speech exceeding the critical sound pressure for protection of listener's hearing is input, the speech can be attenuated more quickly than in the conventional passive limiting circuit. In addition, the speech can be attenuated with less distortion, thereby realizing prevention of difficulty in hearing without causing the listener to feel a sense of congruity.

If the control section compares a time average value with the threshold value and determines that the time average value is smaller than the threshold value, the control section monitors whether the time average value, is kept below the threshold value for a predetermined time. If it is determined that the time average value is kept below the threshold value for the predetermined time, a volume attenuation command for reducing the attenuation amount to "0" is output. Therefore, even if the level of a reception speech varies to a certain degree, a stable operation can be performed. That is, insertion/cancellation of an attenuation command is not frequently performed with such variations, thereby preventing the listener from feeling a sense of incongruity.

If the control section determines that the time average value is kept below the threshold value for the predetermined time, a volume attenuation command is output several times such that the current attenuation amount is gradually reduced to "0". With this operation, the attenuation amount can be reduced more smoothly, and attenuation can be canceled more naturally.

What is claimed is:

1. A reception volume limiting circuit for converting reception speech data as a digital code into an analog receiver driving AC signal, comprising:

a detecting section for performing detection/rectification and smoothing of the receiver driving AC signal and outputting a DC signal corresponding to a level of the receiver driving AC signal;

an A/D conversion section for converting the DC signal from said detecting section into a digital signal;

a control section for calculating a time average value by averaging the digital signal from said A/D conversion section every predetermined time interval, correcting the time average value by adding it to a currently stored attenuation amount, comparing the corrected time average value with a predetermined threshold value representing a critical sound pressure for protection of listener's hearing, calculating an excess level from a difference between the corrected time average value and the threshold value when the corrected time average value exceeds the threshold value, storing the excess level as a current attenuation amount, and outputting a volume attenuation command having the excess level as an attenuation amount; and a speech data calculating section, having means for attenuating a reception volume level by performing subtraction processing of the reception speech data, for performing subtraction processing of the reception speech data, in response to the volume attenuation command from said control section, on the basis of the excess level included in the command and outputting reception speech data attenuated by a value corresponding to the excess level.

2. A circuit according to claim 1, wherein said control section compares the corrected time average value with the threshold value, monitors whether the corrected time average value is kept below the threshold value for a predetermined time, if the corrected time average value is smaller than the threshold value, and outputs a volume attenuation command having an attenuation amount of 0, if the corrected time average value is kept below the threshold value for the predetermined time.

3. A circuit according to claim 2, wherein said control section outputs a volume attenuation command a plurality of number of times such that the current attenuation amount is gradually reduced to zero within the predetermined time.

* * * * *